(12) United States Patent
Pang et al.

(10) Patent No.: US 11,025,751 B2
(45) Date of Patent: *Jun. 1, 2021

(54) METHOD FOR PROCESSING DATA PACKET AND APPARATUS

(71) Applicant: HUAWEI TECHNOLOGIES CO., LTD., Guangdong (CN)

(72) Inventors: Lingli Pang, Shanghai (CN); Xiaoxiao Zheng, Shanghai (CN); Weiguang Fan, Shenzhen (CN); Xuan Xiao, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/728,877

(22) Filed: Dec. 27, 2019

(65) Prior Publication Data

US 2020/0137202 A1 Apr. 30, 2020

Related U.S. Application Data

(63) Continuation of application No. 15/925,746, filed on Mar. 19, 2018, now Pat. No. 10,554,791, which is a continuation of application No. 14/802,561, which is a continuation of application No. PCT/CN2013/070638, filed on Jan. 17, 2013, now Pat. No. 9,954,977.

(51) Int. Cl.
*H04L 29/06* (2006.01)
*H03M 7/30* (2006.01)

(52) U.S. Cl.
CPC .............. *H04L 69/04* (2013.01); *H03M 7/30* (2013.01)

(58) Field of Classification Search
CPC ....... H04L 69/04; H04L 67/2828; H03M 7/30
See application file for complete search history.

(56) References Cited

U.S. PATENT DOCUMENTS

| | | | |
|---|---|---|---|
| 7,257,158 | B1 | 8/2007 | Figueredo et al. |
| 7,564,861 | B1 | 7/2009 | Subbiah |
| 2005/0201737 | A1 | 9/2005 | Choi |
| 2006/0129689 | A1 | 6/2006 | Ho et al. |
| 2006/0262812 | A1 | 11/2006 | Liu et al. |

(Continued)

FOREIGN PATENT DOCUMENTS

| | | |
|---|---|---|
| CN | 1408189 A | 4/2003 |
| CN | 101184109 | 5/2008 |

(Continued)

OTHER PUBLICATIONS

Office Action issued in Chinese Application No. 201810123508.9 dated Jun. 30, 2020, 13 pages (with English translation).

(Continued)

*Primary Examiner* — Pao Sinkantarakorn
*Assistant Examiner* — Kabir U Jahangir
(74) *Attorney, Agent, or Firm* — Fish & Richardson P.C.

(57) ABSTRACT

The present disclosure relates to methods for processing data packet and apparatus. One example method includes sending compression configuration information to a network device, receiving compression configuration information of an application layer packet from the network device, and performing compression processing on the application layer packet at an access layer according to the compression configuration information.

19 Claims, 7 Drawing Sheets

```
Receive or send compression configuration          ,--101
information of an application layer packet
```

```
Perform compression processing or
decompression processing on the              ,--102
application layer packet according to the
compression configuration information
```

(56) References Cited

U.S. PATENT DOCUMENTS

| | | |
|---|---|---|
| 2007/0153916 A1 | 7/2007 | Demircin et al. |
| 2008/0046616 A1 | 2/2008 | Verzunov et al. |
| 2010/0172342 A1 | 7/2010 | Boberg et al. |
| 2011/0085511 A1 | 4/2011 | Fan et al. |
| 2011/0268059 A1 | 11/2011 | Li et al. |
| 2012/0275424 A1 | 11/2012 | Chen et al. |
| 2018/0213065 A1 | 7/2018 | Pang et al. |

FOREIGN PATENT DOCUMENTS

| | | |
|---|---|---|
| CN | 101197825 | 6/2008 |
| CN | 101248642 | 8/2008 |
| CN | 101287008 | 10/2008 |
| CN | 101843071 | 9/2010 |
| CN | 101957836 | 1/2011 |
| CN | 102131234 A | 7/2011 |
| CN | 102255972 | 11/2011 |
| CN | 102684705 | 9/2012 |
| CN | 102761339 | 10/2012 |
| WO | 2009056171 | 5/2009 |
| WO | 2013070168 | 5/2013 |

OTHER PUBLICATIONS

3rd Generation Partnership Project, Technical Specification Group Radio Access Network, Evolved Universal Terrestrial Radio Access (E-UTRA) and Evolved Universal Terrestrial Radio Access Network (E-UTRAN) Overall description, Stage 2 (Release 11 ), 3GPP TS 36.300 V11.4.0, Dec. 2012, 208 pages.

3rd Generation Partnership Project, Technical Specification Group Radio Access Network, Evolved Universal Terrestrial Radio Access (E-UTRA), Packet Data Convergence Protocol (PDCP) specification (Release 11 ); 3GPP TS 36.323 V11.1.0, Dec. 2012, 27 pages.

3rd Generation Partnership Project, Technical Specification Group Radio Access Network, Evolved Universal Terrestrial Radio Access (E-UTRA), Radio Resource Control (RRC), Protocol specification (Release 11), 3GPP TS 36.331 V11.2.0, Dec. 2012, 340 pages.

3rd Generation Partnership Project, Technical Specification Group Radio Access Network, Evolved Universal Terrestrial Radio Access Network (E-UTRAN), M2 Application Protocol (M2AP) (Release 11 ), 3GPP TS 36.443 V11.1.0; Dec. 2012, 84 pages.

3rd Generation Partnership Project, Technical Specification Group Radio Access Network, Radio Resource Control (RRC), Protocol specification (Release 11), 3GPP TS 25.331 V11 .4.0, Dec. 2012, 2056 pages.

Communication Pursuant to Article 94(3) EPC issued in European Application No. 13872237.6 dated May 21, 2019, 5 pages.

Kulkarni et al., "SIP Compression", Internet Citation, Jul. 25, 2001, 4 pages.

Wikipedia.org [online], "HTTP compression," Wikipedia reference, [retrieved on Jul. 9, 2019], available on or before Jul. 7, 2019, retrieved from: URL<https:/len.wikipedia.org/wiki/HTTP compression>, 6 pages.

METHOD FOR PROCESSING DATA PACKET AND APPARATUS

CROSS-REFERENCE TO RELATED APPLICATIONS

This application is a continuation of U.S. application Ser. No. 15/925,746, filed on Mar. 19, 2018, which is a continuation of Ser. No. 14/802,561, filed on Jul. 17, 2015, now U.S. Pat. No. 9,954,977, which is a continuation of International Application No. PCT/CN2013/070638, filed on Jan. 17, 2013. All of the afore-mentioned patent applications are hereby incorporated by reference in their entireties.

TECHNICAL FIELD

The present invention relates to the communications technologies and in particular, to a method for processing data packet and apparatus.

BACKGROUND

A Transmission Control Protocol/Internet Protocol (TCP/IP) packet is a relatively commonly used packet. In order to increase an uplink capacity and improve user data transmission efficiency, compression processing needs to be performed on the TCP/IP packet in a transmission process. In the prior art, a header compression manner is used for a TCP/IP packet, that is, compression is performed on a header of the TCP/IP packet. In the header compression manner, if headers of multiple TCP/IP packets vary little and have high repeatability, compression on the headers of the multiple TCP/IP packets in the header compression manner may improve data transmission efficiency and save a network resource.

In a data transmission process, in addition to header information of the TCP/IP packet, a packet at an application layer above a TCP/IP layer also has similar content, so that compression may be further performed, so as to increase a transmission capacity. However, compression of application layer data is not implemented in the prior art.

SUMMARY

The present invention provides a method for processing data packet and apparatus, so as to reduce overheads of packet transmission and improve utilization of a network resource.

A first aspect of the present invention provides a method for processing data packet, including: receiving or sending compression configuration information of an application layer packet; and performing compression processing or decompression processing on the application layer packet according to the compression configuration information.

In a first possible implementation manner, with reference to the first aspect, before the receiving or sending compression configuration information of an application layer packet, the method further includes: reporting, by UE, compression capability information to a network device, where the compression capability information includes an indication that the UE supports compression performed on the application layer packet.

In a second possible implementation manner, with reference to the first aspect or the first possible implementation manner, the compression capability information further includes a compression algorithm and/or a buffering capability.

In a third possible implementation manner, with reference to the first aspect or the first possible implementation manner or the second possible implementation manner, before the receiving or sending compression configuration information of an application layer packet, the method further includes: reporting, by UE, compression capability information, where the compression capability information includes a compression algorithm and/or a buffering capability.

In a fourth possible implementation manner, with reference to the first aspect or the first possible implementation manner to the third possible implementation manner, the compression capability information further includes any one or a combination of more of a compression manner supported by the UE, a service identification capability and a browser type of the UE.

In a fifth possible implementation manner, with reference to the first aspect or the first possible implementation manner to the fourth possible implementation manner, the compression configuration information includes any one or a combination of more of a compression algorithm, a data buffering capability, a compression manner, a service type of a packet that may be compressed, a domain that may be compressed, a compression direction and compression that is based on previous N packets.

In a sixth possible implementation manner, with reference to the first aspect or the first possible implementation manner to the fifth possible implementation manner, the compression configuration information further includes compression start.

In a seventh possible implementation manner, with reference to the first aspect or the first possible implementation manner to the sixth possible implementation manner, the compression direction instructs to perform compression on an uplink packet, perform compression on a downlink packet, or perform compression on both an uplink packet and a downlink packet.

In an eighth possible implementation manner, with reference to the first aspect or the first possible implementation manner to the seventh possible implementation manner, the compression that is based on previous N packets instructs to perform compression with reference to content of the previous N packets in a compression process, where N is an integer greater than or equal to 0.

In a ninth possible implementation manner, with reference to the first aspect or the first possible implementation manner to the eighth possible implementation manner, the service type of a packet that may be compressed instructs to perform compression on a packet of a corresponding service type.

In a tenth possible implementation manner, with reference to the first aspect or the first possible implementation manner to the ninth possible implementation manner, the performing compression processing on the application layer packet according to the compression configuration information includes: completing compression of the application layer packet at an access layer or a non-access layer.

In an eleventh possible implementation manner, with reference to the first aspect or the first possible implementation manner to the tenth possible implementation manner, the performing compression processing on the application layer packet according to the compression configuration information includes: completing compression of the application layer packet at an access layer and adding compression indication information to a header of the packet that has undergone the compression.

In a twelfth possible implementation manner, with reference to the first aspect or the first possible implementation manner to the eleventh possible implementation manner, the performing compression processing on the application layer packet according to the compression configuration information includes: completing compression of the application layer packet at a PDCP layer and after compression is completed, using a PDU type to indicate compression of the packet.

In a thirteenth possible implementation manner, with reference to the first aspect or the first possible implementation manner to the twelfth possible implementation manner, the method further includes: when UE is handed over to a target network, sending the compression configuration information to the target network device; and receiving a compression configuration response returned by the target network device, where the compression configuration response indicates compression configuration information of the target network device.

In a fourteenth possible implementation manner, with reference to the first aspect or the first possible implementation manner to the thirteenth possible implementation manner, header information of the compressed application layer packet further includes a compression initialization identifier, where the compression initialization identifier is used to indicate an initial packet from which compression restarts.

In a fifteenth possible implementation manner, with reference to the first aspect or the first possible implementation manner to the fourteenth possible implementation manner, the method further includes: receiving measurement configuration information of a network device and detecting a compression rate of the application layer packet according to the measurement configuration information.

In a sixteenth possible implementation manner, with reference to the first aspect or the first possible implementation manner to the fifteenth possible implementation manner, the method further includes: stopping or continuing, according to the compression rate, performing compression processing on the application layer packet.

A second aspect of the present invention provides a packet processing apparatus, including: a transceiving unit, configured to receive or send compression configuration information of an application layer packet; and a processing unit, configured to perform compression processing or decompression processing on the application layer packet according to the compression configuration information.

In a first possible implementation manner, with reference to the second aspect, the transceiving unit is further configured to send compression capability information to a network device, where the compression capability information includes an indication that UE supports compression performed on the application layer packet.

In a second possible implementation manner, with reference to the second aspect or the first possible implementation manner, the compression capability information further includes a compression algorithm and/or a buffering capability.

In a third possible implementation manner, with reference to the second aspect or the first possible implementation manner or the second possible implementation manner, the transceiving unit is further configured to report compression capability information to a network device, where the compression capability information includes a compression algorithm and/or a buffering capability.

In a fourth possible implementation manner, with reference to the second aspect or the first possible implementation manner to the third possible implementation manner, the compression capability information further includes any one or a combination of more of a compression manner supported by the UE, a service identification capability and a browser type of the UE.

In a fifth possible implementation manner, with reference to the second aspect or the first possible implementation manner to the fourth possible implementation manner, the compression configuration information includes any one or a combination of more of a compression algorithm, a data buffering capability, a compression manner, a service type of a packet that may be compressed, a domain that may be compressed, a compression direction and compression that is based on previous N packets.

In a sixth possible implementation manner, with reference to the second aspect or the first possible implementation manner to the fifth possible implementation manner, the compression configuration information further includes compression start.

In a seventh possible implementation manner, with reference to the second aspect or the first possible implementation manner to the sixth possible implementation manner, the compression direction instructs to perform compression on an uplink packet, perform compression on a downlink packet, or perform compression on both an uplink packet and a downlink packet.

In an eighth possible implementation manner, with reference to the second aspect or the first possible implementation manner to the seventh possible implementation manner, the compression that is based on previous N packets instructs to perform compression with reference to content of the previous N packets in a compression process, where N is an integer greater than or equal to 0.

In a ninth possible implementation manner, with reference to the second aspect or the first possible implementation manner to the eighth possible implementation manner, the service type of a packet that may be compressed instructs to perform compression on a packet of a corresponding service type.

In a tenth possible implementation manner, with reference to the second aspect or the first possible implementation manner to the ninth possible implementation manner, that the processing unit is configured to perform compression processing on the application layer packet according to the compression configuration information specifically includes that: the processing unit is configured to complete compression of the application layer packet at an access layer or a non-access layer.

In an eleventh possible implementation manner, with reference to the second aspect or the first possible implementation manner to the tenth possible implementation manner, that the processing unit is configured to perform compression processing on the application layer packet according to the compression configuration information specifically includes that: the processing unit is configured to complete compression of the application layer packet at an access layer and add compression indication information to a header of the packet that has undergone the compression.

In a twelfth possible implementation manner, with reference to the second aspect or the first possible implementation manner to the eleventh possible implementation manner, that the processing unit is configured to perform compression processing on the application layer packet according to the compression configuration information specifically includes that: the processing unit is configured to complete compression of the application layer packet at a PDCP layer and after compression is completed, use a PDU type to indicate compression of the packet.

In a thirteenth possible implementation manner, with reference to the second aspect or the first possible implementation manner to the twelfth possible implementation manner, the transceiving unit is further configured to: when UE is handed over to a target network, send the compression configuration information to the target network device; and is further configured to receive a compression configuration response returned by the target network device, where the compression configuration response indicates compression configuration information of the target network device.

In a fourteenth possible implementation manner, with reference to the second aspect or the first possible implementation manner to the thirteenth possible implementation manner, header information of the compressed application layer packet further includes a compression initialization identifier, where the compression initialization identifier is used to indicate an initial packet from which compression restarts.

In a fifteenth possible implementation manner, with reference to the second aspect or the first possible implementation manner to the fourteenth possible implementation manner, the transceiving unit is further configured to receive measurement configuration information of a network device and the apparatus further includes: a detecting unit, configured to detect a compression rate of the application layer packet according to the measurement configuration information.

In a sixteenth possible implementation manner, with reference to the second aspect or the first possible implementation manner to the fifteenth possible implementation manner, the processing unit is further configured to: stop or continue, according to the detected compression rate of the application layer packet, performing compression processing on the application layer packet.

A third aspect of the present invention provides a packet processing apparatus, including: a transceiver, configured to receive or send compression configuration information of an application layer packet; and a processor, configured to perform compression processing or decompression processing on the application layer packet according to the compression configuration information.

In a first possible implementation manner, with reference to the second aspect the transceiver is further configured to send compression capability information to a network device, where the compression capability information includes an indication that UE supports compression performed on the application layer packet.

In a second possible implementation manner, with reference to the second aspect or the first possible implementation manner, the compression capability information further includes a compression algorithm and/or a buffering capability.

In a third possible implementation manner, with reference to the second aspect or the first possible implementation manner or the second possible implementation manner, the transceiver is further configured to report compression capability information to a network device, where the compression capability information includes a compression algorithm and/or a buffering capability.

In a fourth possible implementation manner, with reference to the second aspect or the first possible implementation manner to the third possible implementation manner, the compression capability information further includes any one or a combination of more of a compression manner supported by the UE, a service identification capability and a browser type of the UE.

In a fifth possible implementation manner, with reference to the second aspect or the first possible implementation manner to the fourth possible implementation manner, the compression configuration information includes any one or a combination of more of a compression algorithm, a data buffering capability, a compression manner, a service type of a packet that may be compressed, a domain that may be compressed, a compression direction and compression that is based on previous N packets.

In a sixth possible implementation manner, with reference to the second aspect or the first possible implementation manner to the fifth possible implementation manner, the compression configuration information further includes compression start.

In a seventh possible implementation manner, with reference to the second aspect or the first possible implementation manner to the sixth possible implementation manner, the compression direction instructs to perform compression on an uplink packet, perform compression on a downlink packet, or perform compression on both an uplink packet and a downlink packet.

In an eighth possible implementation manner, with reference to the second aspect or the first possible implementation manner to the seventh possible implementation manner, the compression that is based on previous N packets instructs to perform compression with reference to content of the previous N packets in a compression process, where N is an integer greater than or equal to 0.

In a ninth possible implementation manner, with reference to the second aspect or the first possible implementation manner to the eighth possible implementation manner, the service type of a packet that may be compressed instructs to perform compression on a packet of a corresponding service type.

In a tenth possible implementation manner, with reference to the second aspect or the first possible implementation manner to the ninth possible implementation manner, that the processor is configured to perform compression processing on the application layer packet according to the compression configuration information specifically includes that: the processor is configured to complete compression of the application layer packet at an access layer or a non-access layer.

In an eleventh possible implementation manner, with reference to the second aspect or the first possible implementation manner to the tenth possible implementation manner, that the processor is configured to perform compression processing on the application layer packet according to the compression configuration information specifically includes that: the processor is configured to complete compression of the application layer packet at an access layer and add compression indication information to a header of the packet that has undergone the compression.

In a twelfth possible implementation manner, with reference to the second aspect or the first possible implementation manner to the eleventh possible implementation manner, that the processor is configured to perform compression processing on the application layer packet according to the compression configuration information specifically includes that: the processor is configured to complete compression of the application layer packet at a PDCP layer and after compression is completed, use a PDU type to indicate compression of the packet.

In a thirteenth possible implementation manner, with reference to the second aspect or the first possible implementation manner to the twelfth possible implementation manner, the transceiver is further configured to: when UE is handed over to a target network, send the compression configuration information to the target network device; and is further configured to receive a compression configuration response returned by the target network device, where the compression configuration response indicates compression configuration information of the target network device.

In a fourteenth possible implementation manner, with reference to the second aspect or the first possible implementation manner to the thirteenth possible implementation manner, header information of the compressed application layer packet further includes a compression initialization identifier, where the compression initialization identifier is used to indicate an initial packet from which compression restarts.

In a fifteenth possible implementation manner, with reference to the second aspect or the first possible implementation manner to the fourteenth possible implementation manner, the transceiver is further configured to receive measurement configuration information of a network device and is configured to detect a compression rate of the application layer packet according to the measurement configuration information.

In a sixteenth possible implementation manner, with reference to the second aspect or the first possible implementation manner to the fifteenth possible implementation manner, the processor is further configured to: stop or continue, according to the detected compression rate of the application layer packet, performing compression processing on the application layer packet.

According to the method for processing data packet provided in the embodiments, compression configuration information of an application layer packet exchanged with a terminal is acquired and compression or decompression processing is performed on the application layer packet according to the compression configuration information, so that compression of the application layer packet can be implemented, thereby reducing overheads of uplink and downlink packet transmission and improving utilization of a network resource.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show some embodiments of the present invention and a person of ordinary skill in the art may still derive other drawings from these accompanying drawings without creative efforts.

DETAILED DESCRIPTION

Figure 1:
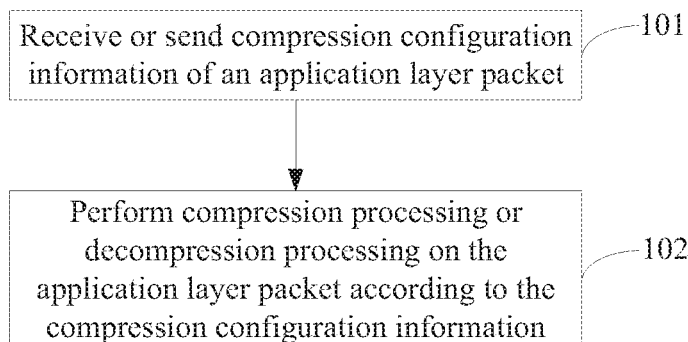
FIG. 1 is a flowchart of Embodiment 1 of a method for processing data packet according to the present invention.

Technologies described in this specification may be applied to various communications systems, for example, current 2G and 3G communications systems and a next-generation communications system, for example, a global system for mobile communications (GSM) system, a code division multiple access (CDMA) system, a time division multiple access (TDMA) system, a wideband code division multiple access (WCDMA) system, a frequency division multiple access (FDMA) system, an orthogonal frequency-division multiple access (OFDMA) system, a single-carrier FDMA (SC-FDMA) system, a general packet radio service (CPRS) system, a long term evolution (LIE) system and other communications systems.

Various aspects are described in this specification with reference to user equipment and/or a base station and/or a base station controller.

The user equipment may be a wireless terminal or a wired terminal. The wireless terminal may refer to a device that provides a user with voice and/or data connectivity, a handheld device with a radio connection function, or another processing device connected to a radio modem. The wireless terminal may communicate with one or more core networks through a radio access network (RAN). The wireless terminal may be a mobile terminal, such as a mobile phone (also referred to as a "cellular" phone) and a computer with a mobile terminal, for example, may be a portable, pocket-sized, handheld, computer built-in, or in-vehicle mobile apparatus, which exchanges voice and/or data with the radio access network. For example, it may be a device such as a personal communication service (PCS) phone, a cordless telephone set, a Session Initiation Protocol (SIP) phone, a wireless local loop (WLL) station, or a personal digital assistant (PDA). The wireless terminal may also be called a system, a subscriber unit, a subscriber station, a mobile station, a mobile terminal, a remote station, an access point, a remote terminal, an access terminal, a user terminal, a user agent, a user device, or user equipment.

The base station (for example, an access point) may refer to a device in communication with a wireless terminal via one or more sectors at an air interface in an access network. The base station may be configured to mutually convert a received over-the-air frame and an IP packet and serve as a router between the wireless terminal and a rest portion of the access network, where the rest portion of the access network may include an Internet protocol (IP) network. The base station may also coordinate attribute management of the air interface. For example, the base station may be a base station (BTS) in GSM or the CDMA, may also be a base station (NodeB) in WCDMA and may further be an evolved NodeB (eNB, or e-NodeB, evolved Node B) in the LTE, which is not limited in this application.

The base station controller may be a base station controller (BSC) in GSM or CDMA, or a radio network controller (RNC) in WCDMA, which is not limited in this application.

In addition, the terms "system" and "network" may be used interchangeably in this specification. The term "and/or" in this specification describes only an association relationship for describing associated objects and represents that three relationships may exist. For example, A and/or B may represent the following three cases: Only A exists, both A and B exist and only B exists. In addition, the character "/" in this specification generally indicates an "or" relationship between the associated objects.

FIG. 1 is a flowchart of Embodiment 1 of a method for processing data packet according to the present invention. The method may be executed by a packet processing apparatus and the apparatus may be implemented by using hardware and/or software and is integrated into a terminal device, where the terminal device may be user equipment (UE) or a relay station. As shown in FIG. 1, the method for processing data packet provided in this embodiment includes:

101. Receive or send compression configuration information of an application layer packet.

For example, UE receives the compression configuration information of the application layer packet from a network device; or a network device sends the compression configuration information of the application layer packet to UE. For example, the network device may be a radio network controller (RNC, Radio Network Controller), a base station (for example, an eNodeB), or a core network device. For example, the core network device may be a gateway GPRS support node (GGSN).

The compression configuration information includes any one or a combination of more of a compression algorithm used for compression, a buffer size, a quantity N of to-be-compressed packets (compression based on previous N packets), a compression manner, a service type of a packet that may be compressed, a compression direction and a domain that may be compressed, where N is an integer greater than or equal to 0.

If the UE supports only one algorithm, or the UE and a network side agree on a compression algorithm, the network side may directly configure compression start, or start compression by configuring a parameter corresponding to the algorithm.

That a terminal acquires the compression configuration information of the application layer packet exchanged with the network device is specifically as follows: receiving compression capability information reported by the network device and acquiring the compression configuration information from the compression capability information.

102. Perform compression processing or decompression processing on the application layer packet according to the compression configuration information.

For example, it may be understood that the terminal or the network device may perform compression on the application layer packet and may also perform decompression processing on a received compressed packet. After compression processing is performed on the application layer packet, a compression identifier is added to header information of the compressed application layer packet, where the compression identifier is used to indicate that compression has been performed on the application layer packet. When receiving the application layer packet, the terminal or the network side may also determine, by parsing the compression identifier in the header information, whether compression has been performed on the packet. If it is determined, according to the compression identifier, that compression has been performed on the packet, decompression processing is performed on the application layer packet according to the compression configuration information.

According to the method for processing data packet provided in this embodiment, compression configuration information of an application layer packet exchanged with a network device is acquired and compression or decompression processing is performed on the application layer packet according to the compression configuration information, so that compression of the application layer packet can be implemented, thereby reducing overheads of packet transmission and improving utilization of a network resource.

Figure 2:
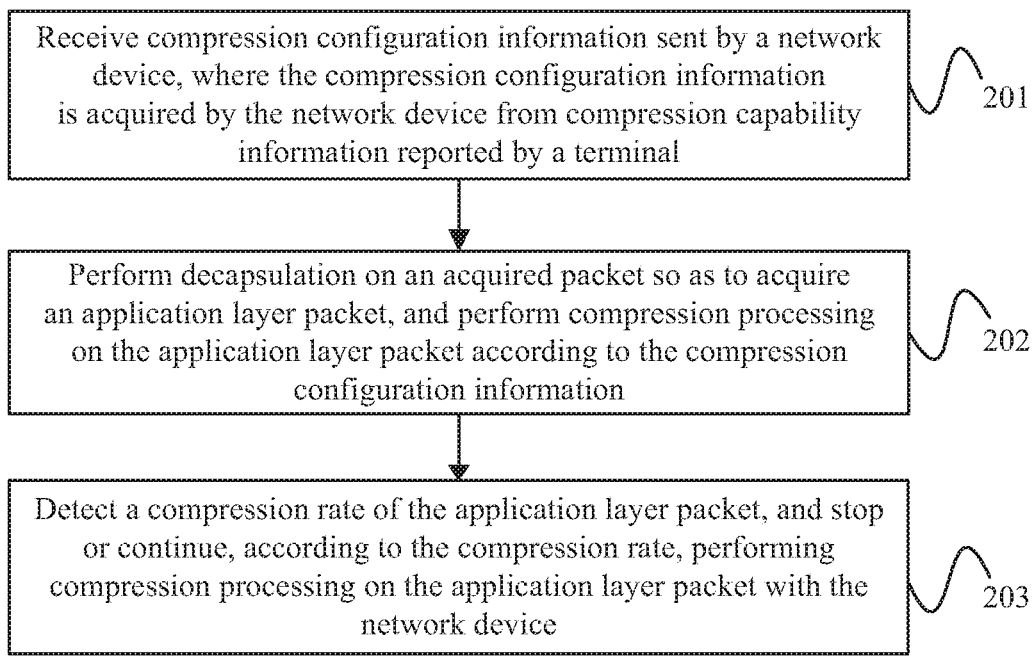
FIG. 2 is a flowchart of Embodiment 2 a method for processing data packet according to the present invention.

FIG. 2 is a flowchart of Embodiment 2 of a method for processing data packet according to the present invention. As shown in FIG. 2, the method provided in this embodiment optimizes the foregoing embodiment and specifically includes the following:

201. Receive compression configuration information sent by a network device.

The compression configuration information is acquired by the network device from compression capability information reported by a terminal. After accessing a network, the terminal starts to report the compression capability information to the network device. The network device acquires the compression configuration information according to the compression capability information reported by the terminal and sends the compression configuration information to the terminal, so that the terminal performs compression or decompression processing according to the compression configuration information.

In this embodiment, the compression capability information reported by the terminal includes a compression algorithm supported by the terminal, a data buffering capability of the terminal, a compression manner and a supported service type. There may be multiple compression algorithms supported by the terminal, such as a gzip compression algorithm, a rar compression algorithm and an LZW compression algorithm. If a network side and a UE side agree that only one compression algorithm is used for compression of an application layer packet, UE only needs to report whether to support compression. The data buffering capability of the terminal is related to the compression algorithm supported by the UE and for some compression algorithms that need a buffer, the UE reports a supported buffering capability. Generally, the data buffering capability of the terminal represents a size of a query dictionary supported by the UE. If a buffer is larger, there are more strings that may be stored, a corresponding compression rate is higher and time taken for compression may be longer. The compression manner supported the terminal is compression based on a current packet or compression based on several previous packets.

If packet compression needs to be completed at an access layer, it is further required that an access layer of the terminal can identify the application layer packet and determine whether the application layer packet needs to be compressed. Therefore, it is required that the access layer can identify a received service layer packet and parse content corresponding to the application layer packet. In this case, the UE may need to report a supported service at the access layer.

Specifically; the network device determines, according to the compression capability information reported by the terminal, the compression configuration information required for compression. For example, the network device determines, according to multiple compression algorithms reported by the UE, one compression algorithm supported by the terminal. If the terminal supports only one compression algorithm, or the terminal and the network device already agree on a compression algorithm, the network device may directly configure the compression algorithm for the terminal.

The network device sets a buffering capability in the compression configuration information according to the data buffering capability reported by the terminal. The data buffering capability of the terminal is related to the compression algorithm supported by the terminal. For some compression algorithms that need a buffer, such as an LZW compression algorithm, the terminal needs to report the buffering capability, where the buffering capability represents a size of a dictionary supported by the terminal. If a dictionary is larger, there is more data that can be buffered, a corresponding compression rate is higher and accordingly time taken for compression may be longer.

The network device determines, according to the compression manner reported by the terminal, that a required compression manner includes the following: compression based on a current packet and compression based on previous N packets. The network device determines, according to the compression manner reported by the terminal, whether compression is performed according to the current packet or compression is performed according to the previous N packets. A compression manner based on the current packet is an internal compression manner. The network device performs compression only according to content of the current packet and does not need to query a dictionary in a buffer. For some algorithms, compression needs to be performed based on the previous N packets. In a process in which the current packet is compressed, a transmit end of the packet needs to query a string in the buffer and determines, based on a size and location of the string in the dictionary; how to perform compression. In this case, the buffer may be updated according to content of the packet. For example, if the content of the current packet is not in the buffer, the content is added to the buffer so as to be used during next packet compression. Further, the UE may perform compression in the foregoing two manners and determine, according to a final compression rate, a compression manner used by each sent packet. In this case, the compression manner supported by UE may also be understood as a buffer updating manner of the UE, that is, whether content corresponding to a packet that is currently compressed by the UE is added to the buffer. If the content corresponding to the current packet is added to the buffer, the UE performs compression according to the current packet; otherwise, the UE performs compression according to data in the buffer.

The network device sets, according to the service type supported by the terminal, a service type required for compression in the compression configuration information. Because the method provided in this embodiment is used for performing compression on the application layer packet, the terminal needs to identify the application layer packet and determine, according to a service type of the application layer packet, whether to perform compression on the packet. For example, if the terminal supports only compression of an application layer packet of a Hypertext Transfer Protocol (HTTP) service, the network device configures, according to the compression capability information reported by the terminal, the service type supported by the terminal in the compression configuration information as the HTTP service.

A compression direction may further be specified in the compression configuration information. For example, compression performed on an uplink packet, or compression performed on a downlink packet, or compression performed on both an uplink packet and a downlink packet is configured. The uplink packet herein refers to a packet sent by the terminal to the network device and the downlink packet refers to a packet sent by the network device to the terminal.

The UE reports a supported browser type and the network side determines, according to the browser type, whether compression needs to be configured.

The terminal may carry the compression capability information in a dedicated radio resource control (RRC) message, where the dedicated RRC message includes inter RAT handover information, an RRC connection setup complete message, a UE capability message (UE capability information), a cell update message (cell update), a URA update message and the like. A specific manner in which the terminal reports the compression capability information is not limited and the compression capability information may be carried in any of the foregoing RRC messages; or the compression capability information may be reported by establishing a dedicated message and the compression capability information may be included in an information element "LE Radio access capability".

The network device sends the acquired compression configuration information to the terminal and the compression configuration information may be carried in a downlink RRC message. For example, the compression configuration information may be carried in messages, such as a radio bearer setup request, a radio bearer configuration message (Radio Bearer Reconfiguration), a cell update (Cell Update Confirm) and RRC connection setup.

202. Perform decapsulation on an acquired packet so as to acquire an application layer packet and perform compression processing on the application layer packet according to the compression configuration information.

Specifically, the method provided in this embodiment is used for performing compression only on the application layer packet and compression may be performed at any layer in a network protocol model. For example, data packet compression may be performed at an access layer and the access layer includes a physical layer PHY, a Media Access Control sub layer MAC, a Radio Link Control layer RLC (Radio Link Control), or a Packet Data Convergence Protocol PDCP layer; or packet compression may be performed at a TCP layer, an IP layer, or an application layer.

When performing packet compression at the application layer, the terminal may directly perform compression on the application layer packet, where decapsulation does not need to be performed and the compression is easy. When compression is performed at another layer, a corresponding packet header is added at each layer, encryption is performed by using a corresponding encryption mechanism and compression is relatively complex. Therefore, when compression is performed on the application layer packet, decapsulation needs to be performed on a packet so as to acquire the application layer packet and perform compression on the application layer packet. Further, a to-be-compressed application layer packet may be determined according to the supported service type in the compression configuration information. For example, in the compression configuration information, compression is supported only on an application layer packet of an HTTP service; a to-be-compressed HTTP packet is determined, according to the compression configuration information and from an application layer packet obtained after decapsulation; and compression or decompression processing is performed on the to-be-compressed HTTP packet according to the compression algorithm and the compression manner in the compression configuration information.

In this embodiment, a compression is performed at the PDCP layer is used as an example for description. For example, after the terminal receives an IP packet from the IP layer, where the IP layer packet includes data packet and an IP header, decapsulation is performed on the IP packet and the IP header is removed so as to obtain an application layer packet. Compression is performed on the application layer packet according to the compression configuration information and the compressed packet is encapsulated into a PDCP packet, where the PDCP packet includes PDCP header information and the compressed packet. Header information of the compressed packet includes a compression identifier (CID), where the CID may be set in a PDCP header, or may be set in the IP header. A value of the CID may be 0 or 1. When the CID=0, it indicates that compression is not performed on the application layer packet in the PDCP packet and a receive end does not need to perform a decompression operation; when the CID=1, it indicates that compression has been performed on the application layer packet in the PDCP packet and the receive end needs to perform the decompression operation.

Specifically, as shown in Table 1, the CD may be set in a reservation bit of a packet identifier (PID) of a PDCP header in a PDCP protocol data unit (PDU) that forms the PDCP packet.

TABLE 1

| | |
|---|---|
| 000 | PDCP Data PDU |
| 001 | PDCP SeqNum PDU |
| 010 | PDCP AMR Data PDU |
| 011-111 | Reserved (PDUs with this encoding are invalid for this version of the protocol) |

It can be learned from Table 1 that, 000, 001 and 010 have already been used, 011-111 are reservation bits and any one of 011-111 may be used to identify that the packet has been compressed.

For example, PDU Type=011 may be used to indicate compression of the application layer packet, or PDU Type=011 represents that compression has been performed on an application layer packet in a PDCP Data PDU. PDU Type=100 represents that compression has been performed on an application layer packet in a PDCP SeqNum PDU. The foregoing are only examples and a specific corresponding value is not limited thereto. The foregoing description only indicates that a PDU Type field may be used to indicate whether compression is performed on the application layer packet. If both header compression and application layer packet compression exist, the transmit end further needs to indicate header compression has been performed on the packet.

It should be noted that, if both header compression and application layer packet compression are performed, the application layer packet compression is represented by using PDU Type=000/001 and header compression is indicated by using a PID field. If compression is performed only on the application layer packet and header compression is not performed, the application layer packet compression is represented by using PDU Type=101 and the PID field does not need to be included; or the application layer packet compression and the header compression represented by using PDU Type=000/001 and PID=00000. If the terminal uses multiple compression algorithms and compression modes, a corresponding compression algorithm and compression mode further need to be indicated in the packet. In this case, a compression indicator field (CI) may need to be added so as to indicate the following content: a compression algorithm corresponding to the packet and a compression mode corresponding to the packet. If the function of application layer packet compression is not completed at the PDCP layer, but is used as a separate functional entity, a packet header corresponding to data that supports the function may be an indication indicating whether compression is performed.

203. Detect a compression rate of the application layer packet and stop or continue, according to the compression rate, performing compression processing on the application layer packet.

After the compression function is enabled and if the terminal detects that compression rates of several consecutive compressed packets are less than a set threshold, the terminal stops performing compression on the application layer packet. If the compression rates are greater than the set threshold, the terminal continues performing compression on the application layer packet. After detecting the compression rate of the application layer packet, the terminal may periodically report the compression rate to the network device.

It should be noted that, in a packet compression process, due to a problem, such as a packet loss or an out-of-synchronization buffer of the terminal, decompression performed by the terminal fails. In order to resolve the problem, in this embodiment, the header information of the compressed application layer packet further includes a compression initialization identifier, where the compression initialization identifier is used to indicate an initial packet from which compression restarts. For example, a compression initialization identifier of a compressed packet that is initially sent instructs to initialize compression once after five packets are compressed. In this way, after every five packets are compressed, compression initialization is performed once and therefore, a failure in decompression of a compressed packet may be reduced by using the method.

A mechanism for processing an error in decompression of a compressed packet is not limited to the foregoing method in the present invention and may also be implemented by using the following methods:

Method 1: The terminal periodically sends a non-compressed packet for the network device to update the buffer. After determining that the buffer is synchronized, the network device sends a compressed packet.

Method 2: When the network device cannot correctly decompress a packet, for example, several consecutive packets cannot be correctly decompressed, the network device notifies the terminal of a failure in decompression of a sent packet. The terminal instructs to initialize compression or synchronize receiving and sending parties. Specifically, the network device may add a decompression failure message in a header of a packet sent to the terminal. After receiving the packet and learning, by means of parsing, that decompression performed by the network device currently fails, the terminal sends an indication message of compression initialization to the network device, or sends non-compressed data packet to the network device so as to determine whether the buffer is synchronized.

Method 3: When the network device cannot correctly decompress a packet, the network device instruct, by adding a compression stop instruction in RRC signaling, the terminal to stop performing compression on the packet.

According to the method provided in this embodiment, a terminal receives compression configuration information sent by a network device, performs decapsulation on an acquired packet so as to acquire an application layer packet and performs compression processing or decompression processing on the application layer packet according to the compression configuration information, so that compression of the application layer packet is implemented, thereby reducing overheads of packet transmission and improving utilization of a network resource.

Figure 3:
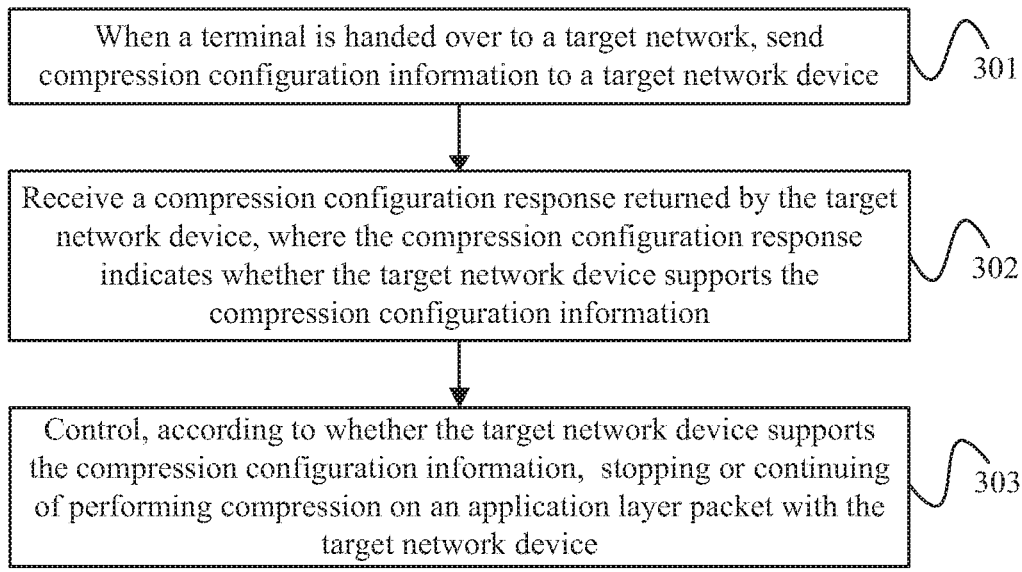
FIG. 3 is a flowchart of Embodiment 3 of a method for processing data packet according to the present invention.

In a process in which a terminal is handed over from a source cell to a target cell, or when an inter RAT handover or RNC migration occurs, continuity of compression of an application layer packet cannot be ensured in the prior art. In order to resolve this problem, Embodiment 3 of the present invention provides a method for processing data packet in a handover process and FIG. 3 is a flowchart of Embodiment 3 of the method for processing data packet according to the present invention. As shown in FIG. 3, the method provided in this embodiment includes the following:

301. When a terminal is handed over to a target network, send compression configuration information to a target network device.

In this embodiment, in the process in which the terminal is handed over from a source network to the target network, the terminal sends, to the target network device, the compression configuration information set in the source network. If a source network device supports compression of an application layer packet, the compression configuration information set for the terminal may be sent to the target network device by using the source network device. If the source network device does not support compression of the application layer packet, the terminal sends compression capability information to the target network device and the target network device acquires the compression configuration information according to the compression capability information.

In this embodiment, the source network device may be a source radio network controller (SRNC) and the target network device may be a target radio network controller (TRNC).

302. Receive a compression configuration response returned by the target network device, where the compression configuration response indicates whether the target network device supports the compression configuration information.

The target network device receives the compression configuration information sent by the terminal and uses whether the target network device supports the capability of the compression configuration information as the compression configuration response and returns the compression configuration response to the terminal, so as to instruct the terminal to stop or continue performing compression on the application layer packet with a device in a network in which the terminal is located.

In this embodiment, if the target network device supports compression of the application layer packet, new compression configuration information is carried in the returned compression configuration response, where the new compression configuration information is acquired by the target network device according to the received compression configuration information set by the source network device for the terminal, or new compression configuration information is acquired by the target network device according to the compression capability information reported by the terminal and the new compression configuration information includes any one or a combination of more of a compression algorithm supported by the terminal, a data buffering capability; a compression manner and a supported service type.

If the target network device does not support compression of the application layer packet, no indication message may be included in the returned compression configuration response. After receiving the compression configuration response returned by the target network device, the terminal learns, by means of parsing, that the compression configuration response does not include any indication message and may learn that the target network device does not support compression of the application layer packet.

303. Control, according to whether the target network device supports the capability of the compression configuration information, stopping or continuing of performing compression on an application layer packet with the target network device.

The terminal receives the compression configuration response sent by the target network device, where the compression configuration response carries whether the target network device supports the capability of the compression configuration information. If the target network device supports the capability of the compression configuration information, compression performed on the application layer packet is continued according to the new compression configuration information that is carried in the compression configuration response and required for performing compression in a new network. If the target network device does not support the capability of the compression configuration information, compression of the application layer packet is stopped.

In this embodiment, the new compression configuration information carried in the compression configuration response is information that is required for the terminal to perform compression in the target network, where the new compression configuration information includes any one or a combination of more of a compression algorithm supported by the terminal, the data buffering capability, the compression manner and the supported service type.

In this embodiment, in a process in which a terminal is handed over from a source network to a target network, the terminal sends compression configuration information to a target network device and the target network device determines, according to the compression configuration information, whether to support a capability of the compression configuration information and notifies the terminal whether to support the capability of the compression configuration information. If the target network device supports the capability of the compression configuration information, set new compression configuration information is carried in a compression configuration response and then sent to the terminal, so as to instruct the terminal to continue performing compression on an application layer packet with the target network device, thereby ensuring continuity of compression of the application layer packet.

Figure 4:
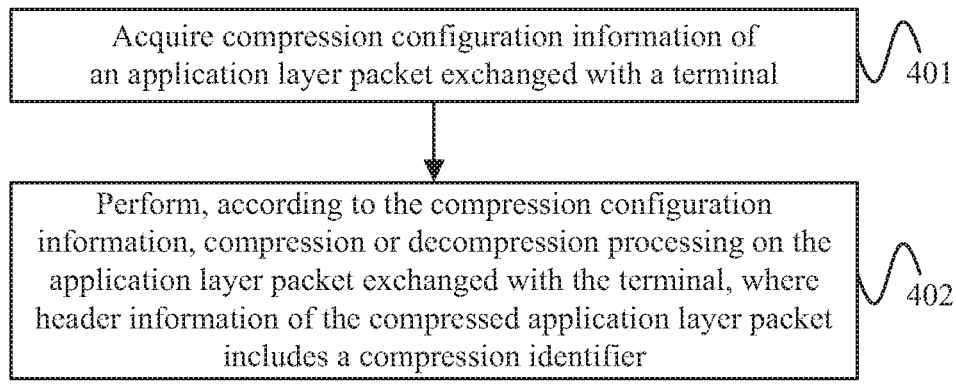
FIG. 4 is a flowchart of Embodiment 4 of a method for processing data packet according to the present invention.

FIG. 4 is a flowchart of Embodiment 4 of a method for processing data packet according to the present invention. The method may be executed by a packet processing apparatus and the apparatus may be implemented by using hardware and/or software and is integrated into a network device, where the network device may be a radio network controller (Radio Network Control, RCN), a gateway GPRS support node (GGSN), or the like. As shown in FIG. 4, the method for processing data packet provided in this embodiment includes:

401. Acquire compression configuration information of an application layer packet exchanged with a terminal.

The compression configuration information includes any one or a combination of more of a compression algorithm supported by the terminal, a data buffering capability; a compression manner and a supported service type. That a network device acquires the compression configuration information of the application layer packet exchanged with the terminal may be specifically as follows: receiving compression capability information reported by the terminal and acquiring the compression configuration information from the compression capability information.

402. Perform, according to the compression configuration information, compression processing or decompression processing on the application layer packet exchanged with the terminal, where header information of the compressed application layer packet includes a compression identifier.

The network device performs, according to the acquired compression configuration information, compression processing or decompression processing on the application layer packet exchanged with the terminal. It may be understood that the network device may perform compression on the application layer packet and may also perform decompression processing on a received compressed packet that is exchanged with the terminal. After compression processing is performed on the application layer packet, the compression identifier is added to the header information of the compressed application layer packet, where the compression identifier is used to indicate that compression has been performed on the application layer packet. When receiving the application layer packet, the network device may also determine, by parsing the compression identifier in the header information, whether compression has been performed on the packet. If it is determined, according to the compression identifier, that compression has been performed on the packet, decompression processing is performed on the application layer packet according to the compression configuration information.

According to the method for processing data packet provided in this embodiment, compression configuration information of an application layer packet exchanged with a terminal is acquired and compression or decompression processing is performed on the application layer packet according to the compression configuration information, so that compression of the application layer packet can be implemented, thereby reducing overheads of packet transmission and improving utilization of a network resource.

Figure 5:
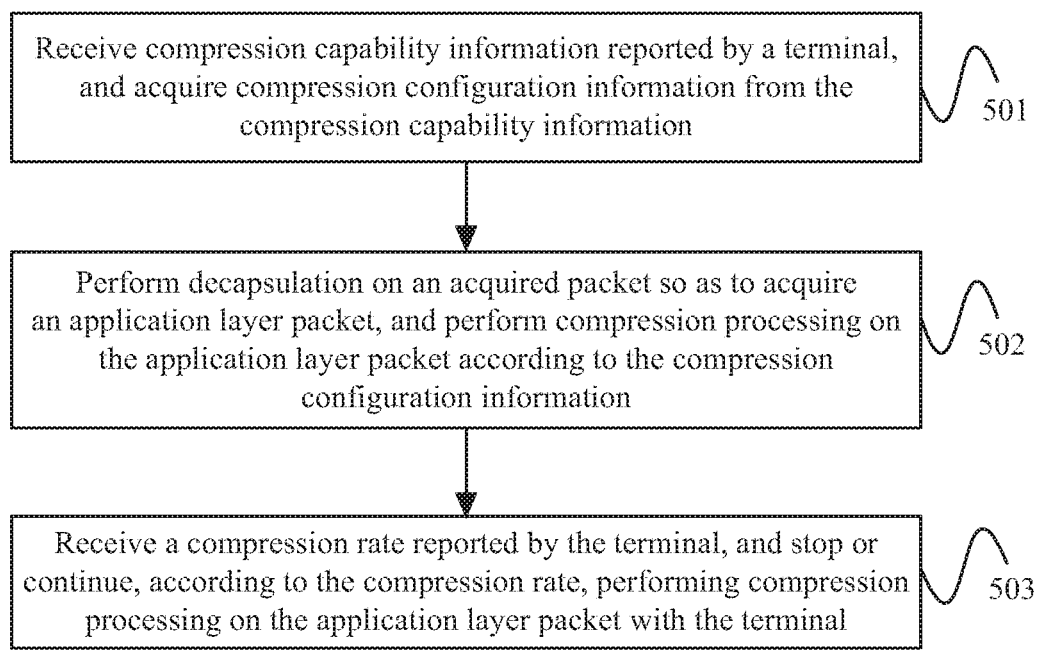
FIG. 5 is a flowchart of Embodiment 5 of a method for processing data packet according to the present invention.

FIG. 5 is a flowchart of Embodiment 5 of a method for processing data packet according to the present invention. As shown in FIG. 5, the method in this embodiment includes the following:

501. Receive compression capability information reported by a terminal and acquire compression configuration information from the compression capability information.

In this embodiment, the compression configuration information includes any one or a combination of more of a compression algorithm used in compression, a buffer size, a quantity N of to-be-compressed packets (compression based on previous N packets), a compression manner, a service type of a packet that may be compressed, a compression direction and a domain that may be compressed. Specifically, in this embodiment, for the compression capability information reported by UE and the compression configuration information configured by a network device, reference may be made to descriptions in Embodiment 2 and details are not described herein again.

502. Perform decapsulation on an acquired packet so as to acquire an application layer packet and perform compression processing on the application layer packet according to the compression configuration information.

Specifically, the method provided in this embodiment is used for performing compression only on the application layer packet and compression may be performed at any layer in a network protocol model. For example, compression may be performed on the packet at a PHY layer, a MAC layer, an RLC layer, or a PDCP layer; or at a TCP layer, an IP layer, or an APP layer.

When compression is performed on the packet at the application layer and because the application layer packet includes only application layer data, compression may be directly performed on the application layer data and the compression is easy. When compression is performed at a subsequent layer, a corresponding packet header is added at each layer, encryption is performed by using a corresponding encryption mechanism and compression is relatively complex. Therefore, when compression is performed on the application layer packet, decapsulation needs to be performed on the acquired packet so as to acquire the application layer packet and perform compression on the application layer packet. Further, a to-be-compressed application layer packet may be determined according to the supported service type in the compression configuration information. For example, in the compression configuration information, compression is supported only on an application layer packet of an HTIP service; it is determined, according to the configuration information, that the to-be-compressed packet is an HTTP packet; and compression or decompression processing is performed on the HTTP packet according to the compression algorithm and the compression manner in the compression configuration information.

For a specific implementation manner, reference may be made to descriptions in Embodiment 2.

503. Receive a compression rate reported by the terminal and stop or continue, according to the compression rate, performing compression processing on the application layer packet with the terminal.

Specifically, after enabling a compression function, the terminal periodically reports the compression rate to the network device. If the network device detects that compression rates of several consecutive compressed packets are less than a set threshold, the network device stops performing compression on the application layer packet. If the compression rates are greater than the set threshold, the network device continues performing compression on the application layer packet.

It should be noted that, in a packet compression process, due to a problem, such as a packet loss or an out-of-synchronization buffer on a network side, decompression performed by the network device fails. In order to resolve the problem, in this embodiment, header information of the compressed application layer packet further includes a compression initialization identifier, where the compression initialization identifier is used to indicate an initial packet from which compression restarts.

According to the packet compression method provided in this embodiment, a network device receives compression capability information reported by a terminal and acquires compression configuration information from the compression capability information; and after performing decapsulation on a received packet to acquire an application layer packet, the network device performs compression processing or decompression processing on the application layer packet according to the compression configuration information, so that compression of the application layer packet is implemented, thereby reducing overheads of packet transmission and improving utilization of a network resource.

Figure 6:
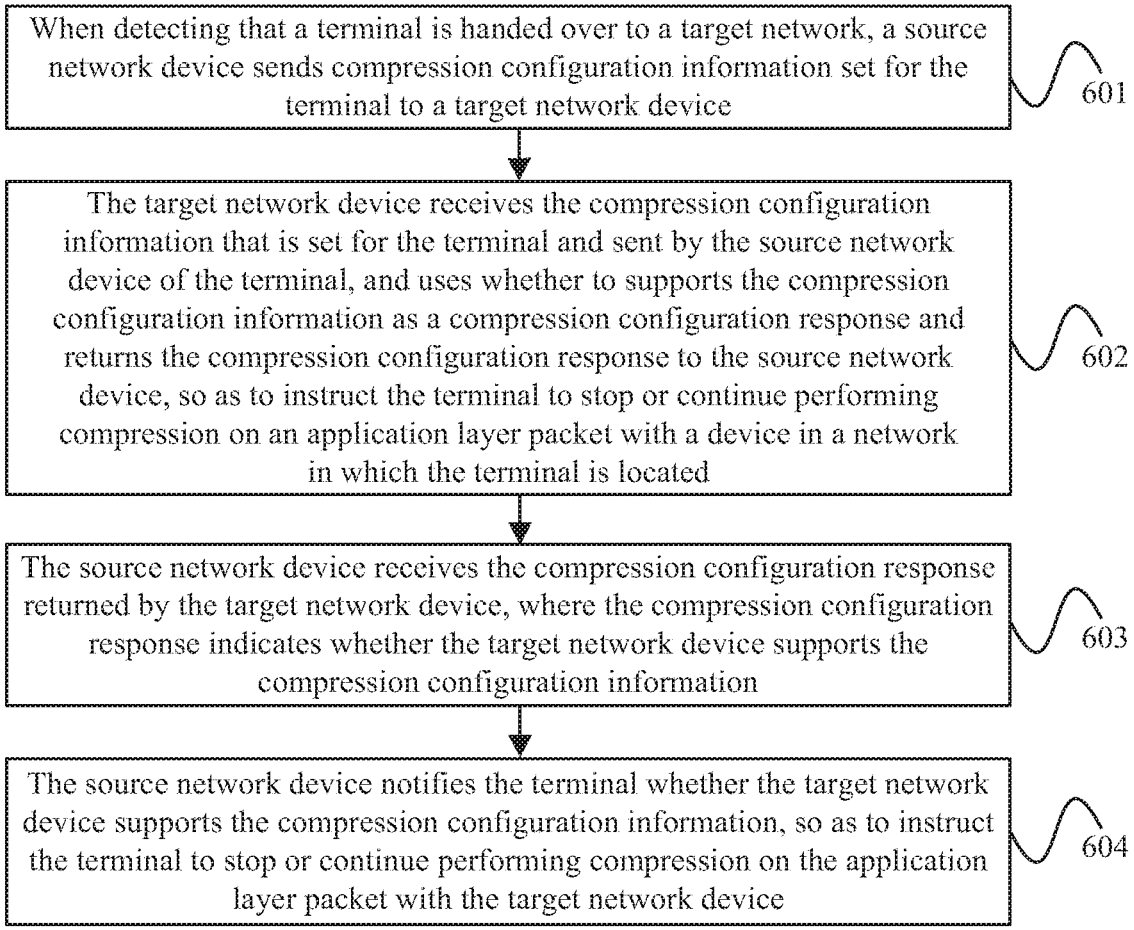
FIG. 6 is a flowchart of Embodiment 6 of a method for processing data packet according to the present invention.

FIG. 6 is a flowchart of Embodiment 6 of a method for processing data packet according to the present invention. The method provided in this embodiment is to keep performing continuous compression on an application layer packet after a terminal is handed over to a new network. As shown in FIG. 6, the method provided in this embodiment includes the following:

601. When detecting that a terminal is handed over to a target network, a source network device sends compression configuration information set for the terminal to a target network device.

In this embodiment, in a process in which the terminal is handed over from a source network to the target network and when detecting that the terminal is handed over to the target network, the source network device sends the compression configuration information set for the terminal to the target network device. An SRNC sends the compression configuration information to a core network (CN) by adding the compression configuration information set for the terminal in a relocation request. Specifically, the compression configuration information set for the terminal may be set in an information element "Source RNC To Target INC Transparent Container" of the relocation request. Then, the CN sends, to a TRNC, the relocation request that carries the compression configuration information. Specifically, the compression configuration information is also set in the information element "Source INC To Target RNC Transparent Container" of the relocation request.

602. The target network device receives the compression configuration information that is set for the terminal and sent by the source network device of the terminal and uses whether to support a capability of the compression configuration information as a compression configuration response and returns the compression configuration response to the source network device, so as to instruct the terminal to stop or continue performing compression on an application layer packet with a device in a network in which the terminal is located.

In this embodiment, if the target network device supports compression of the application layer packet, new compression configuration information is carried in the returned compression configuration response, where the new compression configuration information is acquired by the target network device according to the received compression configuration information that is set by the source network device for the terminal, the new compression configuration information is compression configuration information that is set by the target network device for the terminal and the new compression configuration information includes any one or a combination of more of a compression algorithm supported by the terminal, a data buffering capability, a compression manner and a supported service type.

If the target network device does not support compression of the application layer packet, no indication message may be included in the returned compression configuration response. After receiving the compression configuration response returned by the target network device, the source network device learns, by means of parsing, that the compression configuration response does not include any indication message and may learn that the target network device does not support compression of the application layer packet.

Specifically, the compression configuration response may be sent by the TRNC to the CN and is forwarded by the CN to the SRNC. The new compression configuration information carried in the compression configuration response may be set in a relocation request acknowledgement. For example, the new compression configuration information is set in an information element "Target RNC To Source RNC Transparent Container" of the relocation request acknowledgement.

603. The source network device receives the compression configuration response returned by the target network device, where the compression configuration response indicates whether the target network device supports the capability of the compression configuration information.

After receiving the compression configuration response sent by the target network device, the source network device learns, by means of parsing, whether the target network device supports the capability of the compression configuration information.

604. The source network device notifies the terminal whether the target network device supports the capability of the compression configuration information, so as to instruct the terminal to stop or continue performing compression on the application layer packet with the target network device.

If the target network device supports the capability of the compression configuration information, the source network device notifies the terminal that the target network device supports the capability of the compression configuration information and sends the new compression configuration information to the terminal, so as to instruct the terminal to continue, by using the new compression configuration information, performing compression on the application layer packet with the target network device. If the target network device does not support the capability of the compression configuration information, the source network device notifies the terminal that the target network device does not support the capability of the compression configuration information, so as to instruct the terminal to stop performing compression on the application layer packet with the target network device.

Specifically, the SRNC may notify, by using a downlink RRC message or a downlink PDCP packet, the terminal of the new compression configuration information and whether the target network device supports the capability of the compression configuration information. For example, the new compression configuration information and whether the target network device supports the capability of the compression configuration information are set in a header of the downlink PDCP packet.

In this embodiment, in a process in which a terminal is handed over from a source network to a target network, a source network device sends compression configuration information set for the terminal to a target network device and the target network device determines, according to the compression configuration information, whether to support a capability of the compression configuration information and notifies the terminal whether to support the capability of the compression configuration information. If the target network device supports the capability of the compression configuration information, set new compression configuration information is carried in a compression configuration response and is sent to the terminal by using the source network device, so as to instruct the terminal to continue performing compression on an application layer packet with the target network device, thereby ensuring continuity of compression of the application layer packet.

Figure 7:
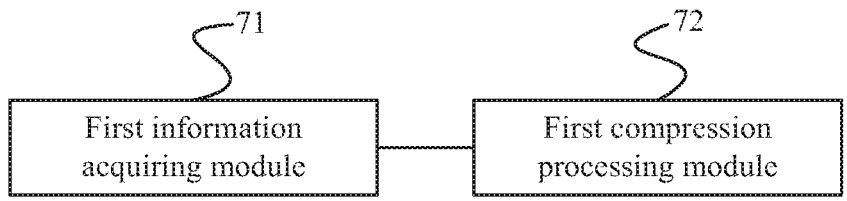
FIG. 7 is a schematic structural diagram of Embodiment 1 of a network device according to the present invention.

FIG. 7 is a schematic structural diagram of Embodiment 1 of a network device according to the present invention. As shown in FIG. 7, the network device provided in this embodiment includes a first information acquiring module 71 and a first compression processing module 72. The first information acquiring module 71 is configured to acquire compression configuration information of an application layer packet exchanged with a terminal and the first compression processing module 72 is configured to perform, according to the compression configuration information, compression processing or decompression processing on the application layer packet exchanged with the terminal, where header information of the compressed application layer packet includes a compression identifier.

The first compression processing module 72 performs, according to the compression configuration information acquired by the first information acquiring module 71, compression processing or decompression processing on the application layer packet exchanged with the terminal. The compression configuration information includes any one or a combination of more of a compression algorithm supported by the terminal, a data buffering capability; a compression manner and a supported service type. The first compression processing module 72 not only can implement compression of the application layer packet, but also can implement decompression of the application layer packet.

The network device provided in this embodiment may be configured to execute a packet compression processing method in Embodiment 1.

After performing compression processing on the application layer packet, the first compression processing module 72 adds the compression identifier to the header information of the compressed application layer packet, where the compression identifier is used to indicate that compression has been performed on the application layer packet. When receiving the application layer packet, the network device may also determine, by parsing the compression identifier in the header information, whether compression has been performed on the packet. If it is determined, according to the compression identifier, that compression has been performed on the packet, decompression processing is performed on the application layer packet according to the compression configuration information.

According to the network device provided in this embodiment, an information acquiring module acquires compression configuration information of an application layer packet exchanged with a terminal and a compression processing module performs compression or decompression processing on the application layer packet according to the compression configuration information, so that compression of the application layer packet can be implemented, thereby reducing overheads of packet transmission and improving utilization of a network resource.

Figure 8:
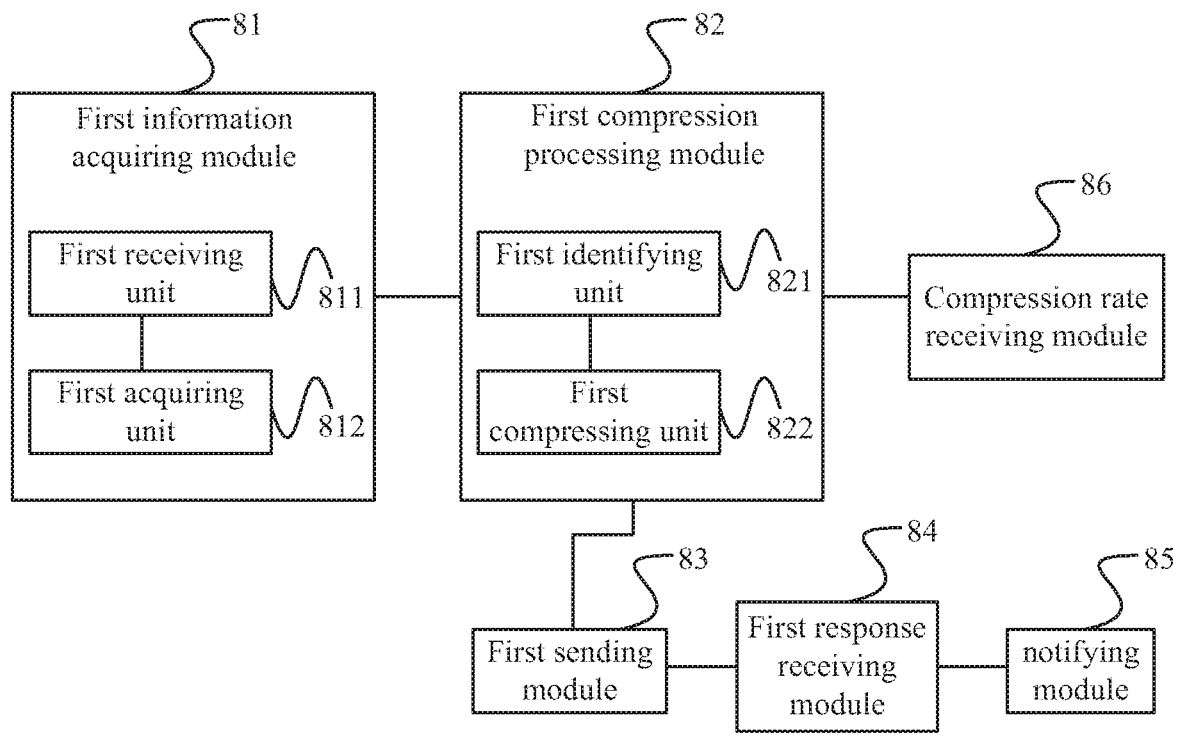
FIG. 8 is a schematic structural diagram of Embodiment 2 of a network device according to the present invention.

FIG. 8 is a schematic structural diagram of Embodiment 2 of a network device according to the present invention. As shown in the figure, the network device provided in this embodiment includes a first information acquiring module 81 and a first compression processing module 82. The first information acquiring module 81 is configured to acquire compression configuration information of an application layer packet exchanged with a terminal and the first compression processing module 82 is configured to perform, according to the compression configuration information, compression processing or decompression processing on the application layer packet exchanged with the terminal, where header information of the compressed application layer packet includes a compression identifier.

The first information acquiring module 81 includes a first receiving unit 811 and a first acquiring unit 812. The first receiving unit 811 is configured to receive compression capability information reported by the terminal and the first acquiring unit 812 is configured to acquire the compression configuration information from the compression capability information. The first acquiring unit 812 acquires the compression configuration information according to the compression capability information that is received by the first receiving unit 811 and reported by the terminal. The compression configuration information acquired by the first acquiring unit 812 includes any one or a combination of more of a compression algorithm supported by the terminal, a data buffering capability, a compression manner and a supported service type.

This embodiment is for performing compression on the application layer packet and therefore, the first compression processing module 82 is specifically configured to: when identifying that a packet that is to be sent to the terminal is the application layer packet, perform, according to the compression configuration information, compression processing on the application layer packet exchanged with the terminal. Further, the first compression processing module 82 may further include: a first identifying unit 821, configured to identify the application layer packet according to the supported service type in the compression configuration information; and a first compressing unit 822, configured to perform, according to the compression algorithm and the compression manner in the compression configuration information, compression processing or decompression processing on the application layer packet exchanged with the terminal.

In order to ensure that compression of the application layer packet can be continued after a terminal handover, the network device provided in this embodiment further includes a first sending module 83, a first response receiving module 84 and a notifying module 85. The first sending module 83 is configured to: when it is detected that the terminal is handed over to a target network, send the compression configuration information set for the terminal to a target network device. The first response receiving module 84 is configured to receive a compression configuration response returned by the target network device, where the compression configuration response indicates whether the target network device supports a capability of the compression configuration information. After the first response receiving module 84 receives the compression configuration response returned by the target network device, the notifying module 85 is configured to notify the terminal whether the target network device supports the capability of the compression configuration information, so as to instruct the terminal to stop or continue performing compression on the application layer packet with the target network device.

In a packet compression process, due to a problem, such as a packet loss or an out-of-synchronization buffer on a network side, decompression performed by the network device fails. In order to resolve the problem, in this embodiment, the header information of the compressed application layer packet further includes a compression initialization identifier, where the compression initialization identifier is used to indicate an initial packet from which compression restarts. By using the initial packet from which compression periodically restarts, a failure in decompression performed by the network device may be effectively avoided.

A mechanism for processing an error in decompression of a compressed packet is not limited to the foregoing method in the present invention and may also be implemented by using other methods, which are not enumerated herein again and reference may be made to description in a method embodiment.

In order to assist the network device in determining whether to perform a compression or decompression operation, a terminal reporting mechanism is introduced. Therefore, the network device provided in this embodiment may further include a compression rate receiving module 86, where the compression rate receiving module 86 is configured to receive a compression rate reported by the terminal and stop or continue, according to the compression rate, performing compression processing on the application layer packet with the terminal.

The network device provided in this embodiment may be configured to execute solutions in Embodiment 1 to Embodiment 3 of the foregoing methods.

According to the network device provided in this embodiment, not only compression and decompression of an application layer packet can be implemented, but also, after a terminal is handed over to a target network, continuous compression of the application layer packet can be implemented. In addition, by adding a compression initialization identifier to header information of the compressed application layer packet, a probability of a failure in decompression of the application layer packet at a receive end may be effectively decreased.

Figure 9:
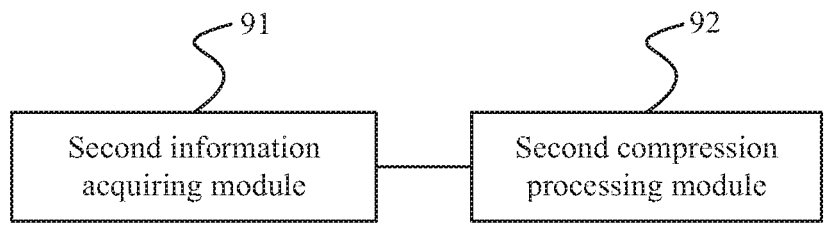
FIG. 9 is a schematic structural diagram of Embodiment 1 of a terminal according to the present invention.

FIG. 9 is a schematic structural diagram of Embodiment 1 of a terminal according to the present invention. As shown in FIG. 9, the terminal provided in this embodiment includes a second information acquiring module 91 and a second compression processing module 92. The second information acquiring module 91 is configured to acquire compression configuration information of an application layer packet exchanged with a network device and the second compression processing module 92 is configured to perform, according to the compression configuration information, compression processing or decompression processing on the application layer packet exchanged with the network device, where header information of the compressed application layer packet includes a compression identifier.

In this embodiment, the compression configuration information includes any one or a combination of more of a compression algorithm supported by the network device, a data buffering capability, a compression manner and a supported service type. The second compression processing module 92 performs, according to the compression configuration information acquired by the second information acquiring module 91, compression processing or decompression processing on the application layer packet exchanged with the network device. The terminal provided in this embodiment may perform compression processing on the application layer packet according to the compression configuration information and adds the compression identifier to the header information of the compressed packet. Accordingly, header information of a received packet is determined and if the header information of the compressed packet includes the compression identifier, decompression processing is performed on the received application layer packet.

The terminal provided in this embodiment may execute a technical solution provided in Method Embodiment 4.

According to the terminal provided in this embodiment, an information acquiring module acquires compression configuration information of an application layer packet exchanged with a network device and a compression processing module performs compression or decompression processing on the application layer packet according to the compression configuration information, so that compression of the application layer packet can be implemented, thereby reducing overheads of packet transmission and improving utilization of a network resource.

Figure 10:
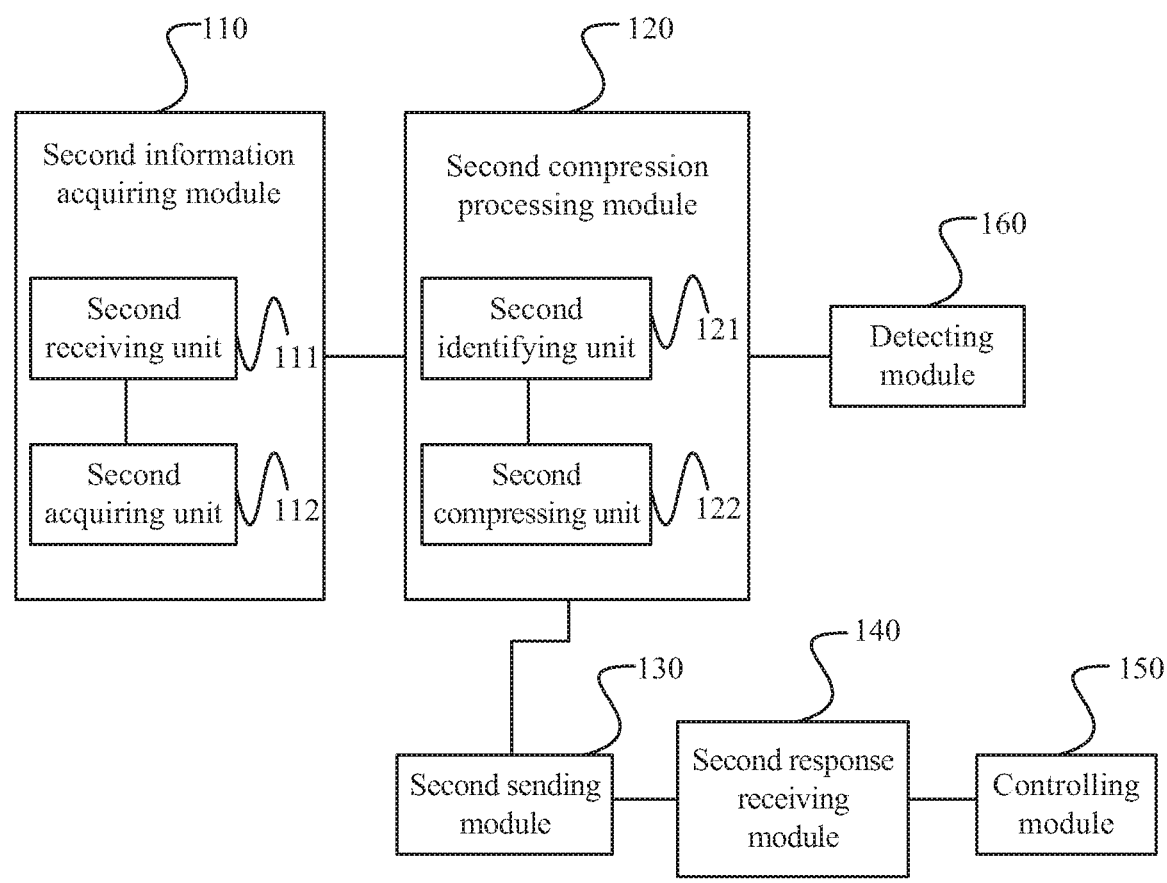
FIG. 10 is a schematic structural diagram of Embodiment 2 of a terminal according to the present invention.

FIG. 10 is a schematic structural diagram of Embodiment 2 of a terminal according to the present invention. As shown in FIG. 10, the terminal provided in this embodiment includes: a second information acquiring module 110, configured to acquire compression configuration information of an application layer packet exchanged with a network device; and a second compression processing module 120, configured to perform, according to the compression configuration information, compression processing or decompression processing on the application layer packet exchanged with the network device, where header information of the compressed application layer packet includes a compression identifier.

The second information acquiring module 110 includes: a second receiving unit 111, configured to receive compression capability information sent by the network device; and a second acquiring unit 112, configured to acquire the compression configuration information from the compression capability information. The second acquiring unit 112 acquires the compression configuration information from the compression capability information according to the compression capability information that is received by the second receiving unit 111 and sent by the network device. The compression configuration information acquired by the second acquiring unit 112 includes any one or a combination of more of a compression algorithm supported by the network device, a data buffering capability, a compression manner and a supported service type.

The second compression processing module 120 is specifically configured to: when identifying that a packet that is to be sent to the network device is the application layer packet, perform, according to the compression configuration information, compression processing on the application layer packet exchanged with the network device. Further, the second compression processing module 120 may include: a second identifying unit 121, configured to identify the application layer packet according to the supported service type in the compression configuration information; and a second compressing unit 122, configured to perform, according to the compression algorithm and the compression manner in the compression configuration information, compression processing or decompression processing on the application layer packet exchanged with the network device. By identifying the application layer packet by using the second identifying unit 121, the second compressing unit 122 may pertinently perform compression on the application layer packet, but not perform compression on a packet header.

The header information of the compressed application layer packet may further include a compression initialization identifier in addition to the compression identifier, where the compression initialization identifier is used to indicate an initial packet from which compression restarts. The initialization identifier is set so as to avoid an error during decompression of the packet.

The terminal provided in this embodiment may further include: a second sending module 130, configured to: when the terminal is handed over to a target network, send the compression configuration information to the target network device; a second response receiving module 140, configured to receive a compression configuration response returned by the target network device, where the compression configuration response indicates whether the target network device supports a capability of the compression configuration information; and a controlling module 150, configured to control stopping or continuing of performing compression on the application layer packet with the target network device.

The terminal provided in this embodiment may further include a detecting module 160, configured to detect a compression rate of the application layer packet and stop or continue, according to the compression rate, performing compression processing on the application layer packet.

According to the terminal provided in this embodiment, not only compression and decompression of an application layer packet can be implemented, but also, after the terminal is handed over to a target network, continuous compression of the application layer packet can be implemented. In addition, a compression initialization identifier is added to header information of the compressed application layer packet, so that a probability of a failure in decompression of the application layer packet at a receive end may be effectively decreased.

Figure 11:
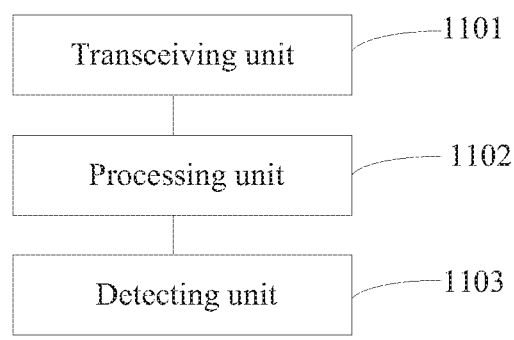
FIG. 11 is a schematic structural diagram of a packet processing apparatus according to the present invention.

As shown in FIG. 11, another embodiment of the present invention provides a packet processing apparatus, including: a transceiving unit 1101, configured to receive or send compression configuration information of an application layer packet; and a processing unit 1102, configured to perform compression processing or decompression processing on the application layer packet according to the compression configuration information.

In the another embodiment of the present invention, the transceiving unit 1101 is further configured to send compression capability information to a network device, where the compression capability information includes an indication that UE supports compression performed on the application layer packet.

In the another embodiment of the present invention, the compression capability information further includes a compression algorithm and/or a buffering capability.

In the another embodiment of the present invention, the transceiving unit 1101 is further configured to report compression capability information to a network device, where the compression capability information includes a compression algorithm and/or a buffering capability.

In the another embodiment of the present invention, the compression capability information further includes any one or a combination of more of a compression manner supported by the UE, a service identification capability and a browser type of the UE.

In the another embodiment of the present invention, the compression configuration information includes any one or a combination of more of a compression algorithm, a data buffering capability, a compression manner, a service type of a packet that may be compressed, a domain that may be compressed, a compression direction and compression that is based on previous N packets.

In the another embodiment of the present invention, the compression configuration information further includes compression start.

In the another embodiment of the present invention, the compression direction instructs to perform compression on an uplink packet, perform compression on a downlink packet, or perform compression on both an uplink packet and a downlink packet.

In the another embodiment of the present invention, the compression that is based on previous N packets instructs to perform compression with reference to content of the previous N packets in a compressing process, where N is an integer greater than or equal to 0.

In the another embodiment of the present invention, the service type of a packet that may be compressed instructs to perform compression on a packet of a corresponding service type.

In the another embodiment of the present invention, that the processing unit 1102 is configured to perform compression processing on the application layer packet according to the compression configuration information specifically includes that: the processing unit 1102 is configured to complete compression of the application layer packet at an access layer or a non-access layer.

In the another embodiment of the present invention, that the processing unit 1102 is configured to perform compression processing on the application layer packet according to the compression configuration information specifically includes that: the processing unit 1102 is configured to complete compression of the application layer packet at an access layer and add compression indication information to a header of the packet that has undergone the compression.

In the another embodiment of the present invention, that the processing unit 1102 is configured to perform compression processing on the application layer packet according to the compression configuration information specifically includes that: the processing unit 1102 is configured to complete compression of the application layer packet at a PDCP layer and after the compression is completed, use a PDU type to indicate compression of the packet.

In the another embodiment of the present invention, the transceiving unit 1101 is further configured to: when UE is handed over to a target network, send the compression configuration information to the target network device; and is further configured to receive a compression configuration response returned by the target network device, where the compression configuration response indicates compression configuration information of the target network device.

In the another embodiment of the present invention, header information of the compressed application layer packet further includes a compression initialization identifier, where the compression initialization identifier is used to indicate an initial packet from which compression restarts.

In the another embodiment of the present invention, the transceiving unit 1101 is further configured to receive measurement configuration information of a network device and the apparatus further includes a detecting unit 1103, configured to detect a compression rate of the application layer packet according to the measurement configuration information.

In the another embodiment of the present invention, the processing unit 1102 is further configured to: stop or continue, according to the detected compression rate of the application layer packet, performing compression processing on the application layer packet.

Figure 12:
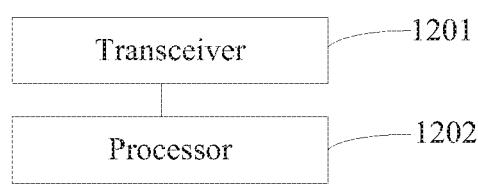
FIG. 12 is a schematic structural diagram of a packet processing apparatus according to the present invention.

As shown in FIG. 12, another embodiment of the present invention provides a packet processing apparatus, including: a transceiver 1201, configured to receive or send compression configuration information of an application layer packet; and a processor 1202, configured to perform compression processing or decompression processing on the application layer packet according to the compression configuration information.

In the another embodiment of the present invention, the transceiver 1201 is further configured to send compression capability information to a network device, where the compression capability information includes an indication that UE supports compression performed on the application layer packet.

In the another embodiment of the present invention, the compression capability information further includes a compression algorithm and/or a buffering capability.

In the another embodiment of the present invention, the transceiver 1201 is further configured to report compression capability information to a network device, where the compression capability information includes a compression algorithm and/or a buffering capability.

In the another embodiment of the present invention, the compression capability information further includes any one or a combination of more of a compression manner supported by the UE, a service identification capability and a browser type of the UE.

In the another embodiment of the present invention, the compression configuration information includes any one or a combination of more of a compression algorithm, a data buffering capability, a compression manner, a service type of a packet that may be compressed, a domain that may be compressed, a compression direction and compression that is based on previous N packets.

In the another embodiment of the present invention, the compression configuration information further includes compression start.

In the another embodiment of the present invention, the compression direction instructs to perform compression on an uplink packet, perform compression on a downlink packet, or perform compression on both an uplink packet and a downlink packet.

In the another embodiment of the present invention, the compression that is based on previous N packets instructs to perform compression with reference to content of the previous N packets in a compressing process, where N is an integer greater than or equal to 0.

In the another embodiment of the present invention, the service type of a packet that may be compressed instructs to perform compression on a packet of a corresponding service type.

In the another embodiment of the present invention, that the processor 1202 is configured to perform compression processing on the application layer packet according to the compression configuration information specifically includes that: the processor 1202 is configured to complete compression of the application layer packet at an access layer or a non-access layer.

In the another embodiment of the present invention, that the processor 1202 is configured to perform compression processing on the application layer packet according to the compression configuration information specifically includes that: the processor 1202 is configured to complete compression of the application layer packet at an access layer and add compression indication information to a header of the packet that has undergone the compression.

In the another embodiment of the present invention, that the processor 1202 is configured to perform compression processing on the application layer packet according to the compression configuration information specifically includes that: the processor 1202 is configured to complete compression of the application layer packet at a PDCP layer and after compression is completed, use a PDU type to indicate compression of the packet.

In the another embodiment of the present invention, the transceiver 1201 is further configured to: when UE is handed over to a target network, send the compression configuration information to the target network device; and is further configured to receive a compression configuration response returned by the target network device, where the compression configuration response indicates compression configuration information of the target network device.

In the another embodiment of the present invention, header information of the compressed application layer packet further includes a compression initialization identifier, where the compression initialization identifier is used to indicate an initial packet from which compression restarts.

In the another embodiment of the present invention, the transceiver 1201 is further configured to receive measurement configuration information of a network device and is configured to detect a compression rate of the application layer packet according to the measurement configuration information.

In the another embodiment of the present invention, the processor 1202 is further configured to: stop or continue, according to the detected compression rate of the application layer packet, performing compression processing on the application layer packet.

It may be clearly understood by a person skilled in the art that, for the purpose of convenient and brief description, division of the foregoing function modules is taken as an example for illustration. In actual application, the foregoing functions can be allocated to different function modules and implemented according to a requirement, that is, an inner structure of an apparatus is divided into different function modules to implement all or some of the functions described above. For a detailed working process of the foregoing system, apparatus and unit, reference may be made to a corresponding process in the foregoing method embodiments and details are not described herein again.

In the several embodiments provided in the present application, it should be understood that the disclosed system, apparatus and method may be implemented in other manners. For example, the described apparatus embodiment is merely exemplary. For example, the module or unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present application essentially, or the part contributing to the prior art, or all or a part of the technical solutions may be implemented in the form of a software product. The software product is stored in a storage medium and includes several instructions for instructing a computer device (which may be a personal computer, a server, or a network device) or a processor to perform all or a part of the steps of the methods described in the embodiments of the present application. The foregoing storage medium includes: any medium that can store program code, such as a USB flash drive, a removable hard disk, a read-only memory (ROM), a random access memory (RAM), a magnetic disk, or an optical disc.

The foregoing embodiments are merely intended for describing the technical solutions of the present application, but not for limiting the present application. Although the present application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present application.

What is claimed is:

1. An apparatus, comprising:
at least one processor; and
a non-transitory computer readable storage medium storing computer programs which, when executed by the at least one processor, cause the apparatus to:
send compression capability information to a network device, wherein the compression capability information comprises an indication indicating that a user equipment supports compression performed on an application layer packet;
receive compression configuration information of the application layer packet from the network device; and
obtain a compressed application layer packet by performing compression processing on the application layer packet at an access layer according to the compression configuration information, wherein a header of the compressed application layer packet includes a compression initialization identifier, and wherein the compression initialization identifier indicates whether the compressed application layer packet is an initial packet from which compression restarts.

2. The apparatus according to claim 1, wherein the compression configuration information further comprises at least one of a compression algorithm, a data buffering capability, a compression manner, a service type of a packet that is compressible, a domain that is compressible, a compression direction, or a compression that is based on previous N packets.

3. The apparatus according to claim 2, wherein the compression direction instructs the user equipment to perform compression on an uplink packet, perform compression on a downlink packet, or perform compression on both the uplink packet and the downlink packet.

4. The apparatus according to claim 1, wherein the compression capability information further comprises at least one of a compression algorithm or a buffering capability.

5. The apparatus according to claim 1, wherein the header of the compressed application layer packet includes compression indication information, and wherein the compression indication information indicates the compressed application layer packet has undergone the compression.

6. The apparatus according to claim 1, wherein the access layer is a packet data convergence protocol (PDCP) layer.

7. An apparatus, comprising:
at least one processor; and
a non-transitory computer readable storage medium storing computer programs which, when executed by the at least one processor, cause the apparatus to:
receive compression capability information from a user equipment, wherein the compression capability information comprises an indication indicating that the user equipment supports compression performed on an application layer packet;
send compression configuration information of the application layer packet to the user equipment;
receive a compressed application layer packet from the user equipment, wherein a header of the compressed application layer packet includes a compression initialization identifier, and wherein the compression initialization identifier indicates whether the compressed application layer packet is an initial packet from which compression restarts; and
perform, at an access layer, decompression processing on the compressed application layer packet from the user equipment according to the compression initialization identifier.

8. The apparatus according to claim 7, wherein the compression configuration information further comprises at least one of a compression algorithm, a data buffering capability, a compression manner, a service type of a packet that is compressible, a domain that is compressible, a compression direction, or a compression that is based on previous N packets.

9. The apparatus according to claim 8, wherein the compression direction instructs the user equipment to perform compression on an uplink packet, perform compression on a downlink packet, or perform compression on both the uplink packet and the downlink packet.

10. The apparatus according to claim 7, wherein the compression capability information further comprises at least one of a compression algorithm or a buffering capability.

11. The apparatus according to claim 7, wherein the header of the compressed application layer packet further includes compression indication information, and wherein the compression indication information indicates the compressed application layer packet has undergone the compression.

12. The apparatus according to claim 7, wherein the access layer is a packet data convergence protocol (PDCP) layer.

13. A method for processing a data packet, the method comprising:
sending compression capability information to a network device, wherein the compression capability information comprises an indication indicating that a user equipment supports compression performed on an application layer packet;
receiving compression configuration information of the application layer packet from the network device; and
obtaining a compressed application layer packet by performing compression processing on the application layer packet at an access layer according to the compression configuration information, wherein a header of the compressed application layer packet includes a compression initialization identifier, and wherein the compression initialization identifier indicates whether the compressed application layer packet is an initial packet from which compression restarts.

14. The method according to claim 13, wherein the compression configuration information further comprises at least one of a compression algorithm, a data buffering capability, a compression manner, a service type of a packet that is compressible, a domain that is compressible, a compression direction, or a compression that is based on previous N packets.

15. The method according to claim 14, wherein the compression direction instructs the user equipment to perform compression on an uplink packet, perform compression on a downlink packet, or perform compression on both the uplink packet and the downlink packet.

16. The method according to claim 13, wherein the compression capability information further comprises at least one of a compression algorithm or a buffering capability.

17. The method according to claim 13, wherein the header of the compressed application layer packet includes compression indication information, and wherein the compression indication information indicates the compressed application layer packet has undergone the compression.

18. The method according to claim 13, wherein the access layer is a packet data convergence protocol (PDCP) layer.

19. A method for processing a data packet, the method comprising:
   receiving compression capability information from a user equipment, wherein the compression capability information comprises an indication that the user equipment supports compression performed on an application layer packet;
   sending compression configuration information of the application layer packet to the user equipment;
   receiving a compressed application layer packet from the user equipment, wherein a header of the compressed application layer packet includes a compression initialization identifier, and wherein the compression initialization identifier indicates whether the compressed application layer packet is an initial packet from which compression restarts; and
   performing, at an access layer, decompression processing on the compressed application layer packet from the user equipment according to the compression initialization identifier.

* * * * *